(12) United States Patent
Tsai et al.

(10) Patent No.: US 10,833,394 B2
(45) Date of Patent: Nov. 10, 2020

(54) ELECTRONIC PACKAGE AND METHOD FOR FABRICATING THE SAME

(71) Applicant: Siliconware Precision Industries Co., Ltd., Taichung (TW)

(72) Inventors: Wen-Jung Tsai, Taichung (TW); Mao-Hua Yeh, Taichung (TW); Chih-Hsien Chiu, Taichung (TW); Ying-Chou Tsai, Taichung (TW); Chun-Chi Ke, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/535,022

(22) Filed: Aug. 7, 2019

(65) Prior Publication Data
US 2020/0235462 A1 Jul. 23, 2020

(30) Foreign Application Priority Data
Jan. 17, 2019 (TW) .............................. 108101822 A (51) Int. Cl.
*H01L 23/00* (2006.01)
*H01Q 1/22* (2006.01)
(Continued)

(52) U.S. Cl.
CPC ....... *H01Q 1/2283* (2013.01); *H01L 21/4853* (2013.01); *H01L 21/4857* (2013.01); *H01L 21/565* (2013.01); *H01L 23/3128* (2013.01); *H01L 23/49822* (2013.01); *H01L 23/49838* (2013.01); *H01L 23/66* (2013.01); *H01L 25/0655* (2013.01); *H01L 25/0657* (2013.01); *H01L 25/50* (2013.01); *H01Q 1/36* (2013.01); *H01L 21/56* (2013.01); *H01L 21/77* (2013.01); *H01L 23/5389* (2013.01); *H01L 24/11* (2013.01); *H01L 24/27* (2013.01); *H01L 2223/6677* (2013.01); *H01L 2223/6688* (2013.01); *H01L 2225/0651* (2013.01); *H01L 2225/06517* (2013.01);
(Continued)

(58) Field of Classification Search
CPC .......... H01Q 1/2283; H01Q 1/38; H01Q 1/40; H01Q 9/0407; H01L 21/56; H01L 21/77; H01L 23/5389; H01L 24/11; H01L 24/27
See application file for complete search history.

(56) References Cited

U.S. PATENT DOCUMENTS

9,431,369 B2 * 8/2016 Chih .................... H01Q 1/2283
10,622,318 B2 * 4/2020 Kim ....................... H01L 23/66
(Continued)

*Primary Examiner* — Thuy Vinh Tran
(74) *Attorney, Agent, or Firm* — Mintz Levin Cohn Ferris Glovsky and Popeo, P.C.; Peter F. Corless; Steven M. Jensen (57) ABSTRACT

An electronic package and a method for fabricating the same are provided. An antenna frame, a first electronic component, and a second electronic component electrically connected to the antenna frame are disposed on a lower side of a carrying structure. An antenna structure is disposed on an upper side of the carrying structure and is electrically connected to the first electronic component. Therefore, two different types of antennas are integrated into an identical electronic package. Such the electronic package bonded to a circuit can transmit signals with two different wavelengths, even if the electronic package does not have any area increased.

32 Claims, 6 Drawing Sheets

(51) Int. Cl.
    *H01L 23/31*     (2006.01)
    *H01L 23/498*     (2006.01)
    *H01L 23/66*     (2006.01)
    *H01L 25/065*     (2006.01)
    *H01L 25/00*     (2006.01)
    *H01L 21/48*     (2006.01)
    *H01L 21/56*     (2006.01)
    *H01Q 1/36*     (2006.01)
    *H01Q 1/38*     (2006.01)
    *H01Q 1/40*     (2006.01)
    *H01Q 9/04*     (2006.01)
    *H01L 23/538*     (2006.01)
    *H01L 21/77*     (2017.01)

(52) U.S. Cl.
    CPC ............... *H01L 2225/06568* (2013.01); *H01L 2225/06586* (2013.01); *H01Q 1/38* (2013.01); *H01Q 1/40* (2013.01); *H01Q 9/0407* (2013.01)

(56) References Cited

U.S. PATENT DOCUMENTS

2014/0035097 A1*   2/2014   Lin .................. H01L 23/66
                                                          257/531
2017/0018513 A1*   1/2017   Yoo .................. H01L 24/19

* cited by examiner

ELECTRONIC PACKAGE AND METHOD FOR FABRICATING THE SAME

CROSS-REFERENCE TO RELATED APPLICATIONS

This application claims priority to Taiwanese Application Serial No. 108101822, filed on Jan. 17, 2019. The entirety of the above-mentioned patent application is hereby incorporated by reference herein and made a part of this specification.

BACKGROUND

1. Technical Field

The present disclosure relates to electronic packages, and, more particularly, to an electronic package having an antenna structure and a method for fabricating the electronic package.

2. Description of the Prior Art

Wireless communication techniques are widely applied to a variety of consumer electronic products, such as mobile phones, tablet computers etc., for receiving and transmitting various wireless signals. In order to meet the requirements that the consumer electronic products are portable and connectible to network (e.g., to watch multimedia contents), a wireless communication module has to be fabricated to be low-profiled and compact-sized. A patch antenna has small volume and weight and is easy to be fabricated, and is widely applied to the wireless communication module of the electronic products.

The multimedia contents have high definition and a huge amount of data, and needs to be transmitted in a great bandwidth. 5G wireless transmission technique thus comes to the market. 5G wireless transmission technique transmits signal at a high frequency, and has a significant demand on the size of the wireless communication module.

5G is applied to a high frequency band from 1 GHz-1,000 GHz, and cooperates with 4G LTE in a commercial application mode. A cellular base station has to be installed outdoors to cooperate with a small base station installed indoors. Therefore, 5G mobile communication will use a great number of antennas within the base station, in order to comply with the great amount of data transmission and low delay that a 5G system requires.

Figure 1:
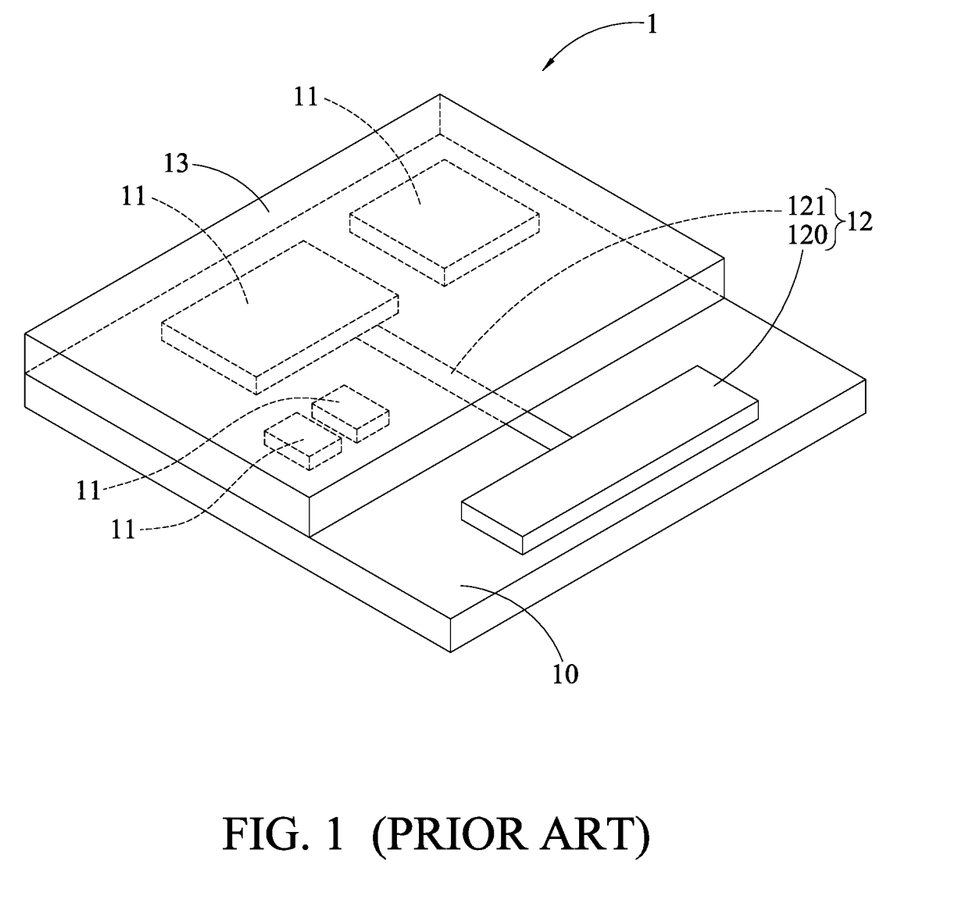
FIG. 1 is a cross-sectional view of a wireless communication module according to the prior art.

FIG. 1 is a schematic diagram of a wireless communication module 1 according to the prior art. The wireless communication module 1 comprises: a substrate 10, a plurality of electronic components 11 disposed on the substrate 10, an antenna structure 12, and a molding compound 13. The substrate 10 is a rectangular circuit board. The electronic components 11 are disposed on and electrically connected to the substrate 10. The antenna structure 12 is planar and has a wire 121a and an antenna body 120 electrically connected via the wire 121a to the electronic components 11. The molding compound 13 covers the electronic components 11 and a portion of the wire 121a.

Due to the high demands of signal quality and transmission speed, a 5G system needs a great number of antennas. However, in the wireless communication module 1, since the antenna structure 12 being planar and the substrate 10 having a fixed size, the antenna structure 12 has limited functions, and cannot cooperate with millimeter wave antennas and Sub-6 Ghz wavelength antennas in the 5G system. Therefore, the wireless communication module 1 cannot meet the operation demands of the antennas in the 5G system.

If an end product (e.g., a smart phone) needs to be installed with both the 5G millimeter wave antenna and the Sub-6 Ghz wavelength antenna, these two antenna packaging structures have to be disposed on a circuit board of the end product. However, packaging structures or passive components having different functions also have to be disposed on other spaces of the circuit board. Therefore, the circuit board must be bulky, and the end product cannot meet the low-profile and compact-size requirements for a modern electronic product.

In consideration of the antenna structure 12 being planar, the electromagnetic radiation characteristics between the antenna structure 12 and the electronic components 11, and the volume limit of the antenna structure 12, during a fabrication process it is hard to integrate the antenna body 120 with the electronic components 11, and the molding compound 13 covers the electronic components 11 only, without also covering the antenna body 120. Therefore, a mold used during a packaging process does not correspond to the size of the substrate 10, but has to have a layout area reserved for the electronic components 11, which is adverse to the packaging process.

Since the antenna structure 12 is planar, a layout area has to be added additionally to the surface of the substrate 10 (i.e., an area where the molding compound 13 is not formed) for the antenna body 120 to be disposed thereon. Therefore, the substrate 10 cannot have a width reduced, and so does the wireless communication module 1. As a result, the wireless communication module 1 cannot meet the compactness requirement.

Therefore, how to overcome the drawbacks of the prior art is becoming an urgent issue in the art.

SUMMARY

In view of the drawbacks of the prior art, the present disclosure provides an electronic package, comprising: a carrying structure having a first side and a second side opposing the first side; an antenna structure disposed on the second side of the carrying structure; an antenna frame disposed on the first side of the carrying structure; a first electronic component mounted on the first side of the carrying structure and coupled to the antenna structure; and a second electronic component mounted on the first side of the carrying structure and coupled to the antenna frame.

The present disclosure further provides a method for fabricating an electronic package, comprising: providing a carrying structure having a first side and a second side opposing the first side; disposing a first electronic component and a second electronic component on the first side of the carrying structure; disposing an antenna structure on the second side of the carrying structure and coupling the first electronic component to the antenna structure; and disposing an antenna frame on the first side of the carrying structure and coupling the second electronic component to the antenna frame.

In an embodiment, the carrying structure comprises a first circuit part electrically connected to the first electronic component and the antenna structure.

In an embodiment, the carrying structure comprises a second circuit part electrically connected to the second electronic component and the antenna frame.

In an embodiment, the antenna structure comprises: an insulator bonded to the second side of the carrying structure and having a first surface and a second surface opposing the first side; and an antenna body comprising a first antenna layer formed on the first surface of the insulator, and a second antenna layer formed on the second surface of the insulator, corresponding to the first antenna layer in position, and bonded to the second side of the carrying structure.

In an embodiment, the antenna structure is a millimeter wave antenna.

In an embodiment, the antenna frame is a Sub-6 GHz wavelength antenna.

In an embodiment, the first electronic component and the second electronic component are different radio frequency chips.

In an embodiment, the first electronic component is a semiconductor chip that can emit a millimeter wave.

In an embodiment, the second electronic component is a semiconductor chip that can emit a wavelength of Sub-6 GHz.

In an embodiment, a plurality of conductive elements are further disposed on the first side of the carrying structure.

In an embodiment, an encapsulating layer is further formed on the first side of the carrying structure and encapsulates the antenna frame, the first electronic component and the second electronic component. In another embodiment, the encapsulating layer has an aperture, from which the carrying structure is exposed, and a conductive element is disposed in the aperture and electrically connected to the carrying structure.

In an embodiment, the first electronic component and the second electronic component are disposed inside the antenna frame.

In an embodiment, at least one of the first electronic component and the second electronic component are disposed outside the antenna frame.

In an embodiment, the first electronic component and the second electronic component are spaced apart from each other on the first side of the carrying structure.

In an embodiment, the first electronic component and the second electronic component are stacked on each other.

It is known from the above that in the electronic package and the method for fabricating the same according to the present disclosure, the antenna structure and the antenna frame are integrated in an identical electronic package. As compared with the prior art, which has two packaging structures disposed on a circuit board, the electronic package can transmit signals with two different wavelengths, even if a circuit board, on which the electronic package is bonded, does not have its area increased. Therefore, the end product using the electronic package according to the present disclosure can meet the low-profile and compact-size requirements.

According to the present disclosure, with the design of the antenna frame, the encapsulating layer can encapsulate the first electronic component, the second electronic component and the antenna frame during a fabrication process. Therefore, a mold used during the fabrication process can correspond to the size of the carrying structure, which is advantageous to the fabrication process.

According to the present disclosure, the antenna frame disposed on the carrying structure formed a 3D antenna, and the carrying structure needs no additional layout area. As compared with the prior art, the present disclosure has versatile antenna functions, even if the size of the carrying structure is not increased. In other words, the electronic package according to the present disclosure can own two different types of antennas and meet the minimization requirement at the same time.

BRIEF DESCRIPTION OF THE DRAWINGS

The disclosure can be more fully understood by reading the following detailed description of the embodiments, with reference made to the accompanying drawings, wherein:

FIGS. 2A' and 2A" are schematic diagrams of another embodiments of FIG. 2A;

DETAILED DESCRIPTION

The following illustrative embodiments are provided to illustrate the disclosure of the present disclosure, these and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the disclosure and therefore do not represent any substantial technical meanings. The present disclosure can also be performed or applied by other different embodiments. The details of the specification may be on the basis of different points and applications, and numerous modifications and variations can be devised without departing from the spirit of the present disclosure. As used herein, the singular forms "a," "an," and "the" are intended to include the plural forms as well, unless the context clearly indicates otherwise. Changes or adjustments are considered to be within the scope of the present disclosure, without departing from the scope of the present disclosure.

Figure 2A:
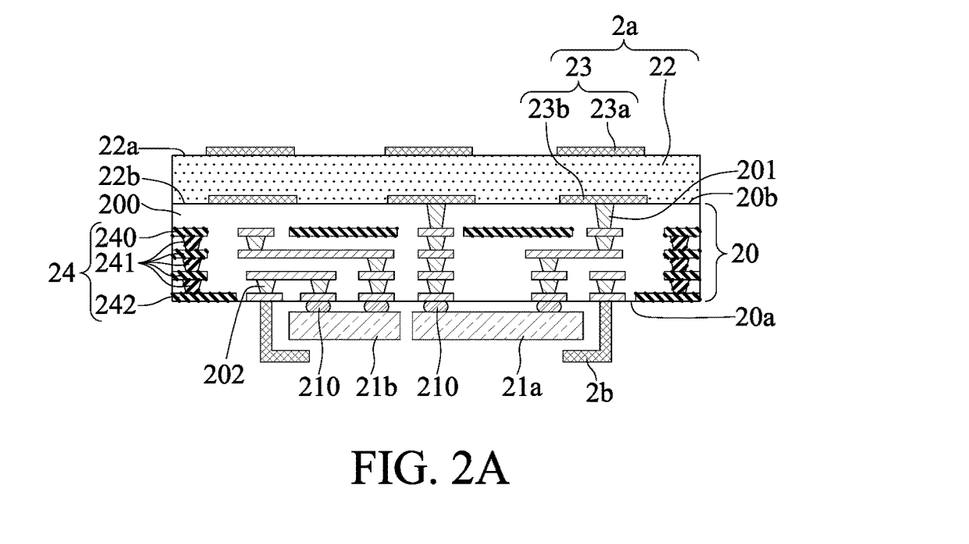
FIGS. 2A-2C are cross-sectional views illustrating a method for fabricating an electronic package of a first embodiment according to the present disclosure.
Figure 2B:
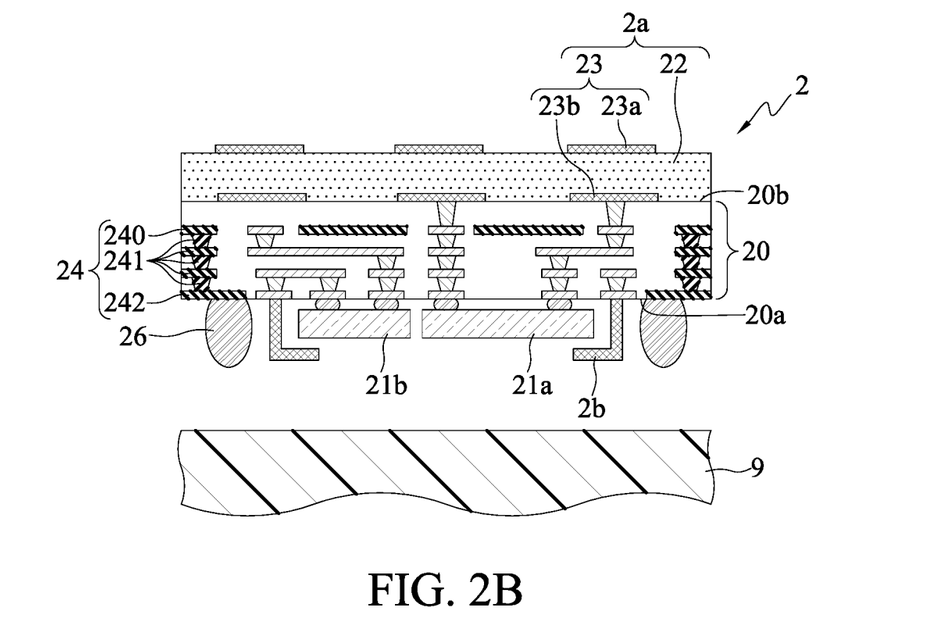
Figure 2C:
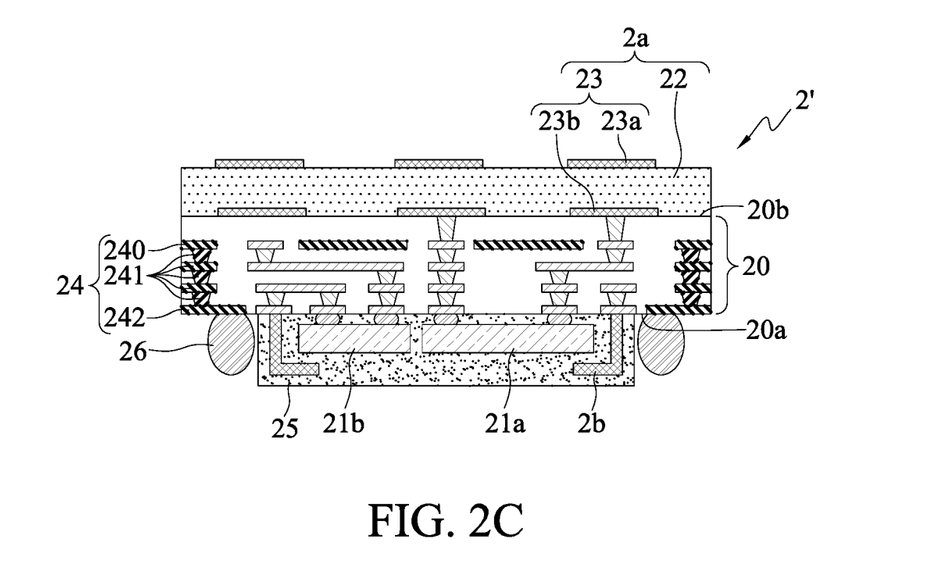

FIGS. 2A-2C are cross-sectional views illustrating a method for fabricating an electronic package of a first embodiment according to the present disclosure.

As shown in FIG. 2A, a carrying structure 20 having a first side 20a and a second side 20b opposing the first side 20a is provided; at least one antenna frame 2b, a first electronic component 21a and a second electronic component 21b are mounted on the first side 20a; and an antenna structure 2a is bonded to the second side 20b.

In an embodiment, the carrying structure 20 is a packaging substrate having a core layer and a circuit structure or a circuit structure having coreless layer, and comprises a dielectric material 200, and at least one first circuit part 201 and at least one second circuit part 202 disposed on the dielectric material 200. In an embodiment, the first circuit part 201 and the second circuit part 202 are a fan out redistribution layer (RDL).

In an embodiment, the carrying structure 20 further comprises a wiring part 24 that has a conductive layer 240 for connecting the antenna structure 2a to ground, at least one layout part 241 electrically connected to the conductive layer 240, the first circuit part 201 and the second circuit part 202, and a plurality of external pads 242 electrically connected to the layout part 241 and exposed from the first side 20a. In an embodiment, the wiring part 24 can be fabricated together with the first circuit part 201 and the second circuit part 202 in the dielectric material 200.

In an embodiment, the conductive layer 240 is a complete or meshed metal foil or a metal foil of any pattern. In another embodiment, the conductive layer 240 is a patterned conductive material.

The first electronic component 21*a* and the second electronic component 21*b* are disposed on the first side 20*a* of the carrying structure 20. In an embodiment, the first electronic component 21*a* and the second electronic component 21*b* are different radio frequency chips.

In an embodiment, the first electronic component 21*a* is a semiconductor chip that can emit a 5G millimeter wave (mm Wave), and is electrically connected to the first circuit part 201. In another embodiment, the second electronic component 21*b* is a semiconductor chip that can emit a Sub-6 GHz wavelength, and is electrically connected to the second circuit part 202.

In an embodiment, the first electronic component 21*a* is disposed on and electrically connected to the first circuit part 201 in a flip-chip manner by a plurality of conductive bumps 210, such as a solder material. In another embodiment, the first electronic component 21*a* is electrically connected to the first circuit part 201 via a plurality of solder wires 211 (as shown in FIG. 2A') in a wiring manner. In yet another embodiment, the first electronic component 21*a* is in direct contact with the first circuit part 201. In still another embodiment, the second electronic component 21*b* is electrically connected to the second circuit part 202 in the above-described manner. The first electronic component 21*a* and the second electronic component 21*b* can be electrically connected to the carrying structure 20 in a manner not limited by the above-mentioned.

During the same process, the electrical connection manner of the first electronic component 21*a* to the carrying structure 20 can be the same as (as shown in FIGS. 2A and 2A') or different from (as shown in FIG. 2A") the electrical connection manner of the second electronic component 21*b* to the carrying structure 20.

In an embodiment, the first electronic component 21*a* and the second electronic component 21*b* are spaced apart from each other on the first side 20*a* of the carrying structure 20 horizontally.

In an embodiment, the antenna structure 2*a* is a millimeter wave antenna and is configured according to the first electronic component 21*a*.

In an embodiment, the antenna structure 2*a* comprises an insulator 22 and an antenna body 23 bonded to the second side 20*b*. In an embodiment, the insulator 22 comprises a first surface 22*a* and a second surface 22*b* opposing the first surface 22*a*, and the second surface 22*b* is bonded to the second side 20*b* of the carrying structure 20. In an embodiment, the insulator 22 is made of, but not limited to polyimide (PI), a dry film, an epoxy, a molding compound etc.

In an embodiment, the antenna body 23 is bonded to the insulator 22 and coupled to (e.g., electrically connected to) the first electronic component 21*a* for emitting a millimeter wave. In an embodiment, the antenna body 23 comprises a first antenna layer 23*a* and a second antenna layer 23*b* separated from each other and formed on two opposing sides of the insulator 22, respectively. In an embodiment, the first antenna layer 23*a* is formed on the first surface 22*a* of the insulator 22, and the second antenna layer 23*b* is formed on the second surface 22*b* of the insulator 22, is in contact with the second side 20*b* of the carrying structure 20, and is electrically connected to the first circuit part 201. In an embodiment, the first antenna layer 23*a* corresponds to the second antenna layer 23*b* in position.

In an embodiment, a thin antenna layer can be fabricated by sputtering, vaporing, electroplating, electroless plating, chemical-plating, foiling etc. In an embodiment, a patterned conductive material is formed on the insulator 22 (or the carrying structure 20) to act as the first antenna layer 23*a* or the second antenna layer 23*b*. In another embodiment, the layout area where the conductive layer 240 is disposed on the carrying structure 20 is greater than the layout area where the second antenna layer 23*b* is bonded to the carrying structure 20.

In an embodiment, the first antenna layer 23*a* and the second antenna layer 23*b* transmit signals in a coupling manner. In another embodiment, the first antenna layer 23*a* and the second antenna layer 23*b* generate radiation power by an alternative voltage, an alternative current or a radiation variation, and the radiation power is an electromagnetic field. Therefore, the first antenna layer 23*a* can be electromagnetically coupled to the second antenna layer 23*b*, allowing antenna signals to be transmitted between the first antenna layer 23*a* and the second antenna layer 23*b*.

In an embodiment, the antenna structure 2*a* can be made, but not limited to, by stacking an antenna substrate on the second side 20*b*.

In an embodiment, the antenna frame 2*b* is a Sub-6 GHz wavelength antenna, and is configured according to the second electronic component 21*b*.

In an embodiment, the antenna frame 2*b* emits a wavelength of Sub-6 GHz by coupling (or electrically connecting) the second circuit part 202 to the second electronic component 21*b*.

As shown in FIG. 2A, the antenna frame 2*b* is around the first electronic component 21*a* and the second electronic component 21*b*. In an embodiment, the first electronic component 21*a* and the second electronic component 21*b* are disposed inside the antenna frame 2*b*. In another embodiment, as shown in FIGS. 2A' and 2A", at least one of the first electronic component 21*a* and the second electronic component 21*b* is disposed outside the antenna frame 2*b*.

Follow the fabrication process of FIG. 2A. As shown in FIG. 2B, a plurality of conductive elements 26 are disposed on the first side 20*a* of the carrying structure 20, to form an electronic package 2. In an embodiment, the electronic package 2 can be bonded via the conductive elements 26 to an electronic device, such as a circuit board 9.

In an embodiment, the conductive elements 26 are solder balls or metal bumps (e.g., copper bumpers), and are disposed on external pads 242 on the first side 20*a* of the carrying structure 20, to be electrically connected to the carrying structure 20.

In subsequent fabrication process, as shown in FIG. 2C, an encapsulating layer 25 can be formed on the first side 20*a* of the carrying structure 20 on demands, and encapsulate the antenna frame 2*b*, the first electronic component 21*a* and the second electronic component 21*b*, to obtain another aspect of the electronic package 2'.

In an embodiment, the encapsulating layer 25 is made of a highly heat conductive material, for dissipating heat from the first electronic component 21*a* and the second electronic component 21*b* and, protecting and preventing the first electronic component 21*a* and the second electronic component 21*b* from being cracked. In an embodiment, the encapsulating layer 25 is made of, but not limited to, polyimide (PI), a dry film, epoxy, a molding compound etc.

In an embodiment, the encapsulating layer 25 encapsulates the conductive bumps 210. In another embodiment, underfill (not shown) is formed between the first side 20a of the carrying structure 20 and the first electronic component 21a (and/or the second electronic component 21b), and encapsulates the conductive bumps 210, and the encapsulating layer 25 encapsulates the underfill.

Figure 2D:
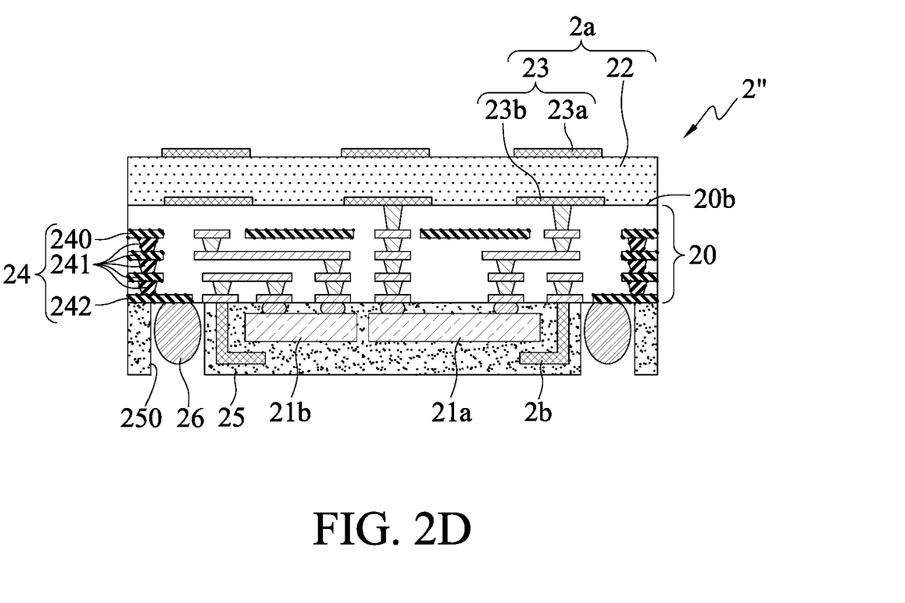
FIG. 2D is a schematic diagram of another embodiment of FIG. 2C.

In another embodiment (not shown), the encapsulating layer 25 encapsulates the conductive element 26 with an end portion of the conductive element 26 exposed from the encapsulating layer 25. In yet another embodiment, as shown in FIG. 2D, in fabricating an electronic package 2" the encapsulating layer 25 is formed first, then an aperture 250 is formed in the encapsulating layer 25, the external pads 242 are exposed from the aperture 250, and the conductive elements 26 are then disposed on external pads 242 in the aperture 250.

Figure 3A:
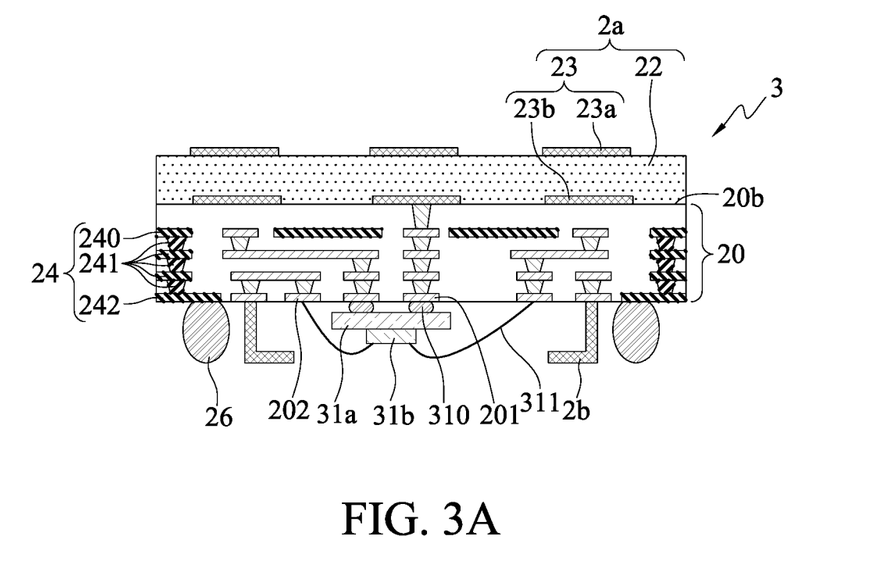
FIGS. 3A-3C are cross-sectional views illustrating a method for fabricating an electronic package of a second embodiment according to the present disclosure.
Figure 3B:
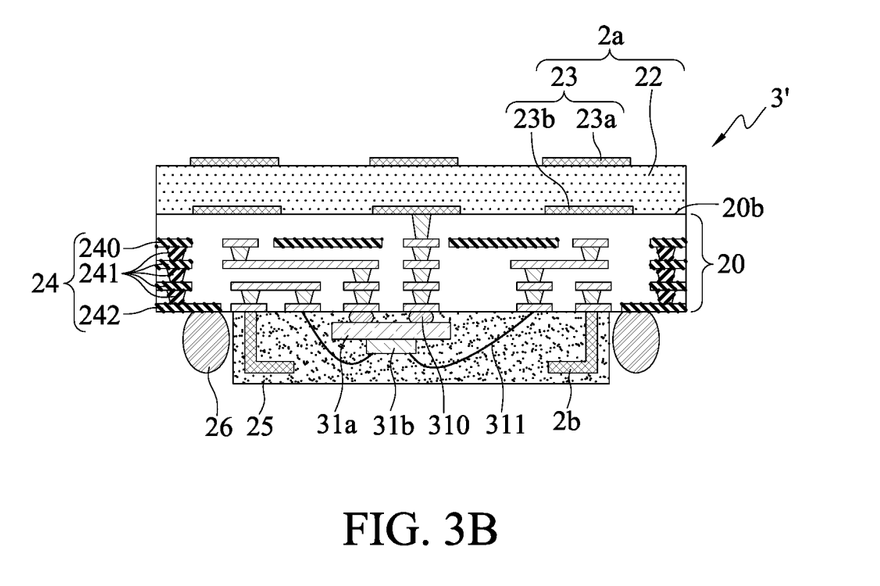
Figure 3C:
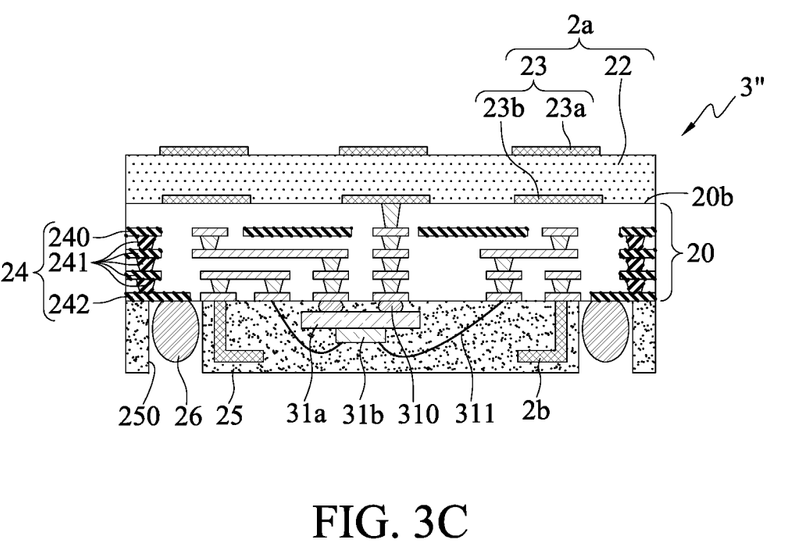

FIGS. 3A-3C are cross-sectional views of an electronic package of a second embodiment according to the present disclosure. The second embodiment differs from the first embodiment in how the electronic components are disposed. Only the difference between the first and second embodiments will be described in the following paragraphs.

As shown in FIGS. 3A-3C, in the fabrication process corresponding to FIG. 2A the first electronic component 31a and the second electronic component 31b are stacked on each other vertically on the first side 20a of the carrying structure 20.

In an embodiment, the first electronic component 31a is disposed on the first circuit part 201 in a flip-chip manner via a plurality of conductive bumps 310, such as a solder material, and is electrically connected to the first circuit part 201, and the second electronic component 31b is stacked on the first electronic component 31a and electrically connected to the second circuit part 202 in a wiring manner via a plurality of solder wires 311.

In the subsequent fabrication process, electronic packages 3, 3' and 3" can be obtained based on the fabrication process shown in FIGS. 2B-2D.

It can be appreciated that the second electronic component 31b can also be disposed on the second circuit part 202 in a flip-chip manner and electrically connected to the second circuit part 202, and the first electronic component 31a can also be stacked on the second electronic component 31b and electrically connected to the first circuit part 201 in a wiring manner via a plurality of solder wires 311.

In a method for fabricating an electronic package according to the present disclosure, two different antennas, e.g., the antenna structure 2a and the antenna frame 2b, can be integrated into an identical electronic package 2, 2', 2", 3, 3', 3". Compared with the prior art, which discloses that two packaging structures are disposed on a circuit board, the present invention discloses that a circuit board 9 on which an electronic package 2, 2', 2", 3, 3', 3" is bonded needs not add an area. Therefore, the end product using the electronic package 2, 2', 2", 3, 3', 3" according to the present disclosure can meet the low-profile and compact-size requirements.

In a method for fabricating an electronic package according to the present disclosure, a metal foil is bended to form a 3D antenna frame 2b, the antenna frame 2b and the first and second electronic components 21a and 21b can be integrated with each other and be packaged together, and the encapsulating layer 25 can encapsulate the antenna frame 2b and the first and second electronic components 21a and 21b. Therefore, a mold used during the packaging process can correspond to the size of the carrying structure 20, which is advantageous to the packaging process.

The antenna frame 2b is mounted on the carrying structure 20 to form a 3D antenna. Therefore, no layout area is required to be added to the surface of the first side 20a of the carrying structure 20. As compared with the prior art, the method for fabricating an electronic package according to the present disclosure allows more antenna functions (i.e. signal functions of Sub-6 GHz wavelength) to be realized even if the size of the carrying structure 20 is not increased. Therefore, the electronic package 2, 2', 2", 3, 3', 3" thus fabricated according to the present disclosure can have functions of two different antennas, and also meet the minimization requirement.

In a method for fabricating an electronic package according to the present disclosure, the first antenna layer 23a and the second antenna layer 23b formed on two opposing sides of the insulator 22, respectively, are formed on the second side 20b of the carrying structure 20, to form the 3D antenna body 23. Therefore, a mold used during the packaging process can correspond to the size of the carrying structure 20, which is advantageous to the packaging process. It is thus not required to add an additional layout area on the surface of the second side 20b of the carrying structure 20. In a method for fabricating an electronic package according to the present disclosure, antennas (i.e., a millimeter wave antenna) can be fabricated even if the size of the carrying structure 20 is not increased, and the electronic package 2, 2', 2", 3, 3', 3" thus fabricated can meet the minimization requirement.

The conductive layer 240 can protect the first electronic component 21a and the second electronic component 21b from cross talking, noise interfering and radiation interference of the antenna structure 2a.

The present disclosure further provides an electronic package 2, 2', 2", 3, 3', 3", which comprises a carrying structure 20, a first electronic component 21a, 31a, a second electronic component 21b, 31b, an antenna structure 2a, and an antenna frame 2b.

The carrying structure 20 has a first side 20a and a second side 20b opposing the first side 20a.

The antenna structure 2a is disposed on the second side 20b of the carrying structure 20.

The antenna frame 2b is disposed on the first side 20a of the carrying structure 20.

The first electronic component 21a, 31a is mounted on the first side 20a of the carrying structure 20 and electrically connected to the antenna structure 2a.

The second electronic component 21b, 31b is mounted on the first side 20a of the carrying structure 20 and electrically connected to the antenna frame 2b.

In an embodiment, the carrying structure 20 comprises a first circuit part 201 electrically connected to the first electronic component 21a, 31a and the antenna structure 2a.

In an embodiment, the carrying structure 20 comprises a second circuit part 202 electrically connected to the second electronic component 21b, 31b and the antenna frame 2b.

In an embodiment, the antenna structure 2a comprises an insulator 22 and an antenna body 23, the antenna body 23 comprises a first antenna layer 23a and a second antenna layer 23b corresponding to the first antenna layer 23a in position, and the insulator 22 and the second antenna layer 23b are bonded to the second side 20b of the carrying structure 20.

In an embodiment, the antenna structure 2a is a millimeter wave antenna.

In an embodiment, the antenna frame 2b is a Sub-6 GHz wavelength antenna.

In an embodiment, the first and second electronic components 21a, 21b, 31a, 31b are different radio frequency chips.

In an embodiment, the first electronic component 21a, 31a is a semiconductor chip that can emit a millimeter wave.

In an embodiment, the second electronic component 21b, 31b is a semiconductor chip that can emit a Sub-6 GHz wavelength.

In an embodiment, the electronic package 2, 2', 2", 3, 3', 3" further comprises a plurality of conductive elements 26 disposed on the first side 20a of the carrying structure 20 and electrically connected to the wiring part 24 of the carrying structure 20.

In an embodiment, the electronic package 2', 2", 3', 3" further comprises an encapsulating layer 25 formed on the first side 20a of the carrying structure 20 and encapsulating the antenna frame 2b and the first and second electronic components 21a, 21b, 31a, 31b. The encapsulating layer 25 has an aperture, from which the carrying structure 20 is exposed. A conductive element 26 is disposed in the aperture 250 and electrically connected to the wiring part 24 of the carrying structure 20.

In an embodiment, the first electronic component 21a and the second electronic component 21b are spaced apart from each other on the first side 20a of the carrying structure 20.

In an embodiment, the first electronic component 31a and the second electronic component 31b are stacked on each other.

It is known from the above that in the electronic package and the method for fabricating the same according to the present disclosure, two different antennas (e.g., the antenna structure and the antenna frame) are integrated in an identical electronic package, the electronic package can transmit signals with two different wavelengths, even if the circuit board on which electronic package is bonded does not its area increased. Therefore, the end product using the electronic package according to the present disclosure can meet the low-profile and compact-size requirements.

According to the present disclosure, with the design of the antenna frame the encapsulating layer can encapsulate the first electronic component, the second electronic component and the antenna frame during a fabrication process. Therefore, a mold used during the fabrication process can correspond to the size of the carrying structure, which is advantageous to the fabrication process.

According to the present disclosure, the antenna frame is disposed on the carrying structure and forms a 3D antenna, and the carrying structure needs no additional layout area. The present disclosure has versatile antenna functions, even if the size of the carrying structure is not increased. In other words, the electronic package according to the present disclosure can own two different types of antennas and meet the minimization requirement at the same time.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

The invention claimed is:

1. An electronic package, comprising:
a carrying structure having a first side and a second side opposing the first side;
an antenna structure disposed on the second side of the carrying structure;
an antenna frame disposed on the first side of the carrying structure;
a first electronic component mounted on the first side of the carrying structure and coupled to the antenna structure; and
a second electronic component mounted on the first side of the carrying structure and coupled to the antenna frame.

2. The electronic package of claim 1, wherein the carrying structure comprises a first circuit part electrically connected to the first electronic component and the antenna structure.

3. The electronic package of claim 1, wherein the carrying structure comprises a second circuit part electrically connected to the second electronic component and the antenna frame.

4. The electronic package of claim 1, wherein the antenna structure comprises:
an insulator bonded to the second side of the carrying structure and having a first surface and a second surface opposing the first surface; and
an antenna body, comprising:
a first antenna layer formed on the first surface of the insulator; and
a second antenna layer formed on the second surface of the insulator, corresponding to the first antenna layer in position, and bonded to the second side of the carrying structure.

5. The electronic package of claim 1, wherein the antenna structure is a millimeter wave antenna.

6. The electronic package of claim 1, wherein the antenna frame is a Sub-6 GHz wavelength antenna.

7. The electronic package of claim 1, wherein the first electronic component and the second electronic component are different radio frequency chips.

8. The electronic package of claim 1, wherein the first electronic component is a semiconductor chip emitting a millimeter wave.

9. The electronic package of claim 1, wherein the second electronic component is a semiconductor chip emitting a wavelength of Sub-6 GHz.

10. The electronic package of claim 1, further comprising a plurality of conductive elements disposed on the first side of the carrying structure.

11. The electronic package of claim 1, further comprising an encapsulating layer formed on the first side of the carrying structure and encapsulating the antenna frame, the first electronic component and the second electronic component.

12. The electronic package of claim 11, wherein the encapsulating layer comprises an aperture, from which the carrying structure is exposed, with a conductive element disposed in the aperture and electrically connected to the carrying structure.

13. The electronic package of claim 1, wherein the first electronic component and the second electronic component are disposed inside the antenna frame.

14. The electronic package of claim 1, wherein at least one of the first electronic component and the second electronic component is disposed outside the antenna frame.

15. The electronic package of claim 1, wherein the first electronic component and the second electronic component are spaced apart from each other on the first side of the carrying structure.

16. The electronic package of claim 1, wherein the first electronic component and the second electronic component are stacked on each other.

17. A method for fabricating an electronic package, comprising:

providing a carrying structure having a first side and a second side opposing the first side;

disposing a first electronic component and a second electronic component on the first side of the carrying structure;

disposing an antenna structure on the second side of the carrying structure and coupling the first electronic component to the antenna structure; and disposing an antenna frame on the first side of the carrying structure and coupling the second electronic component to the antenna frame.

18. The method of claim 17, wherein the carrying structure comprises a first circuit part electrically connected to the first electronic component and the antenna structure.

19. The method of claim 17, wherein the carrying structure comprises a second circuit part electrically connected to the second electronic component and the antenna frame.

20. The method of claim 17, wherein the antenna structure comprises:
  an insulator bonded to the second side of the carrying structure and having a first surface and a second surface opposing the first surface; and
  an antenna body, comprising:
    a first antenna layer formed on the first surface of the insulator; and
    a second antenna layer formed on the second surface of the insulator, corresponding to the first antenna layer in position, and bonded to the second side of the carrying structure.

21. The method of claim 17, wherein the antenna structure is a millimeter wave antenna.

22. The method of claim 17, wherein the antenna frame is a Sub-6 GHz wavelength antenna.

23. The method of claim 17, wherein the first electronic component and the second electronic component are different radio frequency chips.

24. The method of claim 17, wherein the first electronic component is a semiconductor chip emitting a millimeter wave.

25. The method of claim 17, wherein the second electronic component is a semiconductor chip emitting a wavelength of Sub-6 GHz.

26. The method of claim 17, further comprising disposing a plurality of conductive elements on the first side of the carrying structure.

27. The method of claim 17, further comprising forming on the first side of the carrying structure an encapsulating layer encapsulating the antenna frame, the first electronic component and the second electronic component.

28. The method of claim 27, wherein the encapsulating layer has an aperture, from which the carrying structure is exposed, with a conductive element disposed in the aperture and electrically connected to the carrying structure.

29. The method of claim 17, wherein the first electronic component and the second electronic component are disposed inside the antenna frame.

30. The method of claim 17, wherein at least one of the first electronic component and the second electronic component is disposed outside the antenna frame.

31. The method of claim 17, wherein the first electronic component and the second electronic component are spaced apart from each other on the first side of the carrying structure.

32. The method of claim 17, wherein the first electronic component and the second electronic component are stacked on each other.

* * * * *